United States Patent [19]

Tsai

[11] Patent Number: 5,763,306
[45] Date of Patent: Jun. 9, 1998

[54] METHOD OF FABRICATING CAPACITOR OVER BIT LINE COB STRUCTURE FOR A VERY HIGH DENSITY DRAM APPLICATIONS

[75] Inventor: Hong-Hsiang Tsai, Hsinchu, Taiwan

[73] Assignee: Vanguard International Semiconductor Corporation, Hsin-Chu, Taiwan

[21] Appl. No.: 957,675

[22] Filed: Oct. 24, 1997

[51] Int. Cl.⁶ .......................... H01L 21/8242; H01L 21/20
[52] U.S. Cl. ................................ 438/255; 438/398
[58] Field of Search ........................ 438/238, 239, 438/253, 254, 255, 381, 396, 397, 398; 257/306, 309

[56] References Cited

U.S. PATENT DOCUMENTS

| | | | |
|---|---|---|---|
| 5,338,700 | 8/1994 | Dennison et al. | 438/255 |
| 5,401,681 | 3/1995 | Dennison | 438/255 |
| 5,447,882 | 9/1995 | Kim | 437/60 |
| 5,478,768 | 12/1995 | Iwasa | 437/52 |

*Primary Examiner*—Joni Chang
*Attorney, Agent, or Firm*—George O. Saile; Stephen B. Ackerman

[57] ABSTRACT

A method of creating a deep pocket, capacitor over bit line structure, used for high density, DRAM designs, has been developed. The process consists of creating silicon nitride covered, polysilicon bit line structures, on an insulator layer, contacting an underlying source and drain region. A series of layers are next deposited, and patterned, to form the initial phase of a storage node contact hole, terminating at the surface of the silicon nitride covered polysilicon bit line structures. After formation of insulator spacers, protecting the silicon nitride covered, polysilicon bit line structures, the final phase of the storage node contact hole is formed, between polysilicon bit line structures, using RIE procedures. A storage node structure, featuring an HSG silicon layer, is formed on the inside surface of the storage node contact hole, followed by the creation of a capacitor dielectric layer, and an upper electrode structure, resulting in a deep pocket, capacitor over bit line structure.

32 Claims, 11 Drawing Sheets

METHOD OF FABRICATING CAPACITOR OVER BIT LINE COB STRUCTURE FOR A VERY HIGH DENSITY DRAM APPLICATIONS

BACKGROUND OF THE INVENTION (1) Field of the Invention

The present invention relates to a method of fabricating a dynamic random access memory, (DRAM), device, and more specifically to a method of fabricating a capacitor structure for the DRAM device.

(2) Description of the Prior Art

The attainment of high density DRAM devices has been limited by the inability of the semiconductor industry to provide the capacitor structures, needed for large scale DRAM integration. The limited area allotted for the capacitor structure has led to novel capacitor designs, targeted at increasing capacitor area, and thus increasing capacitance. For example Kim, in U.S. Pat. No. 5,447,882, describes a novel storage node configuration, for a stacked capacitor structure, in which a crown shaped, storage node is comprised of protruding polysilicon features, resulting in an increase in capacitor surface area. However this type of configuration adds complexity to fabrication sequence used to create the stacked capacitor structure, and does not supply the surface area needed for high density DRAM cells.

Another method of increasing capacitor surface area has been the use of a capacitor over bit line, (COB), cell structure, where a storage capacitor is formed upon a bit line in order to increase DRAM capacitance, while minimizing cell size. Iwasa, in U.S. Pat. No. 5,478,768, describes a COB structure in which the storage node capacitance is increased by using novel fabrication sequences, applied to the storage node contact hole. This invention will describe a deep pocket, COB capacitor structure featuring a hemispherical grained, (HSG), polysilicon layer, only on the inside surfaces of the storage node contact hole, resulting in increased surface area, however avoiding the HSG layer, and HSG residues, on the outside of the storage node contact hole, thus reducing the difficulties in attaining minimum node spacings to be achieved. This invention will also describe the creation of insulator spacers, between the storage node structure, and the bit line structures, allowing improved isolation and yield to result.

SUMMARY OF THE INVENTION

It is an object of this invention to create an increased surface area, capacitor structure, for application in high density DRAM cells.

It is another object of this invention to create a deep pocket, COB structure, in the storage node contact hole, using an HSG polysilicon layer, on the inside surfaces of the storage node contact hole.

It is still another object of this invention to use two silicon nitride layers, one on the bit line structure, and the other silicon nitride layer on a silicon oxide layer that overlies the bit line structure, to provide the etch selectivity, needed for the creation of the storage node contact hole.

It is still yet another object of this invention to use silicon oxide spacers, between the storage node structure and the bit line structure, to increase isolation yield.

In accordance with the present invention a deep pocket, COB structure, has been developed for use in high density DRAM cells. Transfer gate transistor structures are formed, and passivated with a silicon nitride cap layer, as well as silicon nitride sidewall spacers. A first silicon oxide layer is deposited, followed by the creation of a bit line contact hole, formed in the first silicon oxide layer. A first polysilicon layer is next deposited, followed by patterning of the first polysilicon layer, creating a bit line structure. Subsequent depositions are performed, comprising a first layer of silicon nitride, conformally covering the polysilicon bit line structures, a second silicon oxide layer, planarized to create a smooth top surface topography, a second silicon nitride layer, a third silicon oxide layer, and a second polysilicon layer. A first opening, for the storage node contact hole, is made in the second polysilicon layer, in the third silicon oxide layer, in the second silicon nitride layer, and in the second silicon oxide layer, stopping at the first silicon nitride layer, overlying the polysilicon bit line structures. The structure is next subjected to a wet etch solution, containing hydrofluoric acid, creating a first opening, for the storage node contact hole, featuring a third, and a second silicon oxide layer, in which the exposed sides are recessed back under the second polysilicon, and the second silicon nitride layers. A fourth silicon oxide layer is deposited, conformally coating the first opening, for the storage node contact hole, and filling the recessed regions in the third and second silicon oxide layers. The opening of the storage node contact hole is completed via maskless, dry etching of the fourth silicon oxide layer, followed by dry etching of the first silicon nitride layer, and the first silicon oxide layer, exposing a source and drain region between two underlying transfer gate transistors. The second polysilicon layer allowed the selective removal of these layers to be performed. The storage node contact hole is protected from the polysilicon bit line, by the silicon oxide spacers, created from the fourth silicon oxide layer, on the sidewall of the storage node contact hole, adjacent to the polysilicon bit line structures. The removal of the insulator spacers, from the sidewall of the storage node contact hole, adjacent to the third silicon oxide layer, results in a deep pocket, storage node contact hole, wider in diameter at the top, and narrower in diameter at the bottom of the hole. The materials used to create a storage node structure, comprised of an underlying doped polysilicon layer, followed by the deposition of an HSG layer, with a surface containing concave and convex features, thus providing the desired surface area increase, are next deposited. A spin on glass oxide layer, or a borophosphosilicate glass, is next applied, filling the storage node contact hole, and followed by a dry etch back, or chemical mechanical polishing procedure, used to remove the HSG silicon layer, as well as the third and second polysilicon layers from the top surface of the third silicon oxide layer. A wet etch is then employed to remove the SOG or BPSG layer from inside the storage node contact hole, also removing the third silicon oxide layer from the top surface of the second silicon nitride layer, resulting in doped polysilicon - HSG shapes, protruding from the top surface of the second silicon nitride layer. The creation of a capacitor dielectric layer, on the storage node structure, followed by the formation of a polysilicon cell plate, or upper electrode, complete the capacitor structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of creating a DRAM cell, with a deep pocket COB structure, will now be described in detail. The metal oxide semiconductor field effect transistor, (MOSFET), used for the transfer gate transistor of the DRAM cell, will be described as an N type, (NFET), device. If desired the MOSFET device can easily be fabricated to be a P type, (PFET), device.

Figure 1:
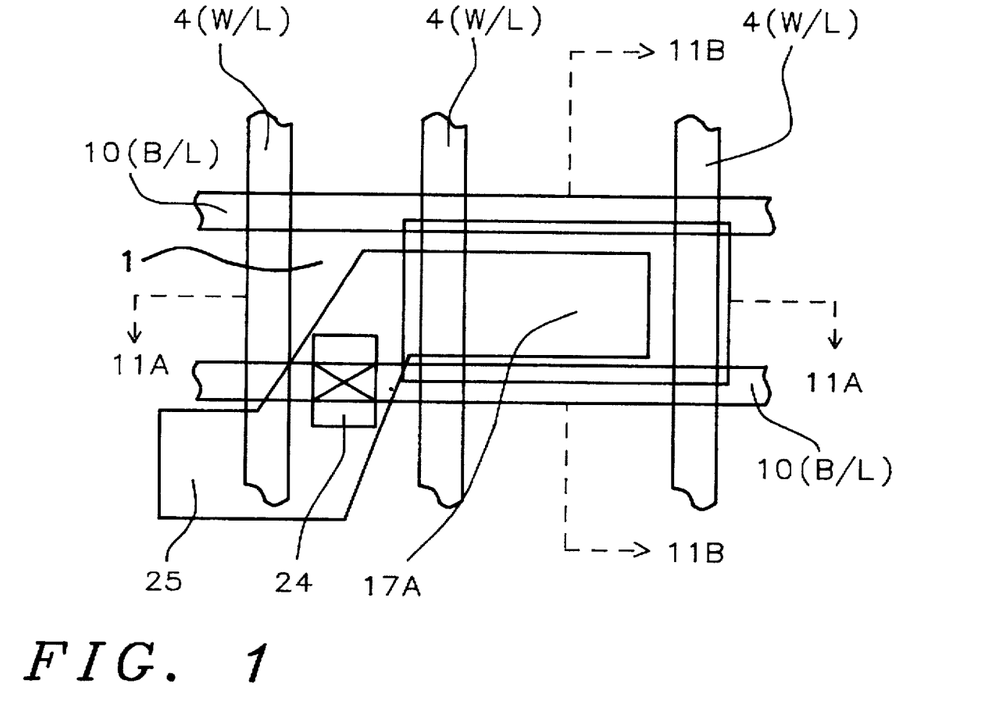
FIG. 1, which schematically shows the top view of a DRAM cell, with a deep pocket COB structure.

FIG. 1, schematically shows the top view of the DRAM cell, with the deep pocket COB structure. Word lines 4, fabricated as polysilicon gate structures, are shown traversing device region 1, between field oxide regions 2. Bit lines 10, contact silicon device region, of semiconductor substrate 1, in bit line contact hole 24, but in other areas are isolated from the silicon device region and word lines 4, by a thick insulator layer, (not shown in FIG. 1). The storage node contact hole 17a, as well as the COB structure 25, are also shown in FIG. 1.

Figure 2A:
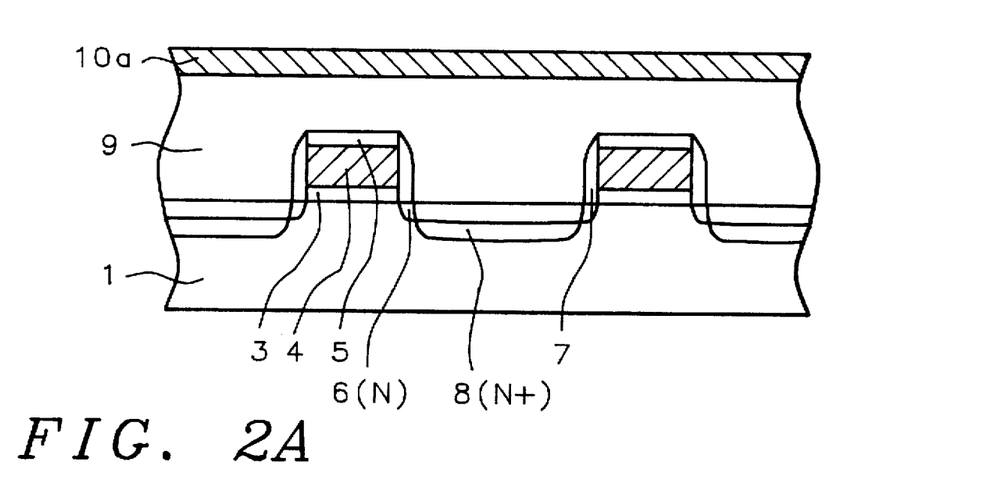
FIGS. 2a, 3a, 4a, 5a, 6a, 7a, 8a, 9a, 10a and 11a, which schematically in cross-sectional style, using the AA' direction, show the significant fabrication stages, used to create the DRAM cell, with the deep pocket COB structure.
Figure 2B:
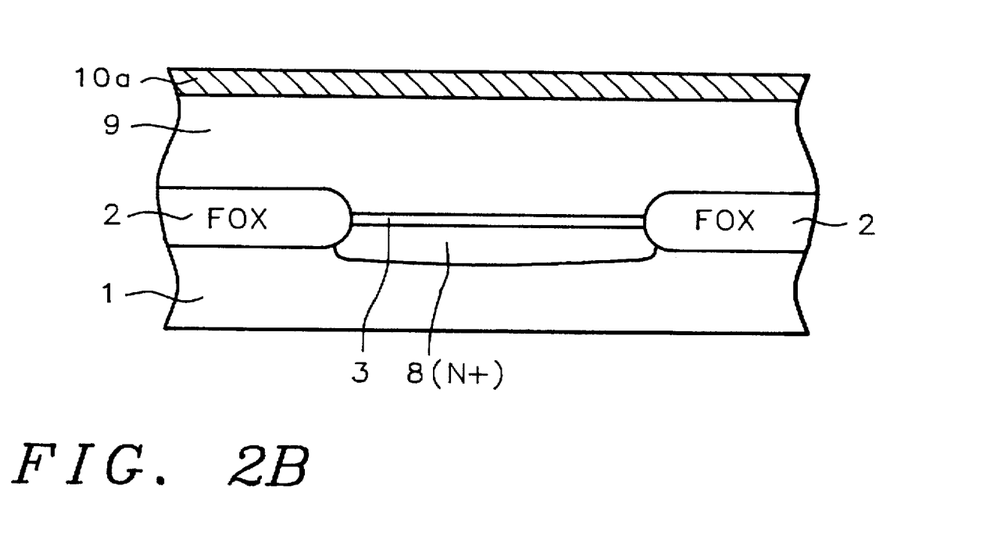
FIGS. 2b, 3b, 4b, 5b, 6b, 7b, 8b, 9b, 10b and 11b, and which schematically in cross-sectional style, using the BB' direction, normal in direction to the cross-sections shown in FIGS. 2a–11a, again show the significant fabrication stages, used to create the DRAM cell, with the deep pocket. COB structure.

Referring to FIGS. 2a and 2b, a P type, semiconductor substrate, 1, with a <100>, single crystalline orientation, is used. FIGS. 2a –11a, will cross-sectionally show the DRAM cell in one direction, (the AA' direction), while FIGS. 2b –11b, cross-sectionally describe the DRAM cell, using the BB' direction. Field oxide, (FOX), regions, 2, are used for purposes of isolation, and shown in schematically in FIG. 2b. Briefly the FOX regions, 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions, 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer.

After a series of wet cleans, a gate insulator layer, 3, of silicon oxide is thermally grown in an oxygen-steam ambient, at a temperature between about 850° to 1050° C., to a thickness between about 50 to 200 Angstroms. A polysilicon layer is next deposited using low pressure chemical vapor deposition, (LPCVD), procedures, at a temperature between about 500° to 700° C., to a thickness between about 1500 to 4000 Angstroms. The polysilicon can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. A capping insulator layer 5, comprised of silicon nitride, or a composite of underlying silicon oxide, and overlying silicon nitride, is next deposited, using either LPCVD or plasma enhanced chemical vapor deposition, (PECVD), procedures, to a thickness between about 1000 to 3000 Angstroms. Conventional photolithographic and reactive ion etching, (RIE), procedures, using CHF$_3$ as an etchant for insulator layer 5, and using Cl$_2$ as an etchant for polysilicon layer 4, are used to create a polysilicon gate structure, used as the word lines for the DRAM structure, and shown schematically in FIG. 2a, using the AA' direction. The BB' direction, shown in FIG. 2b, shows a view of the ongoing DRAM device, from between the polysilicon word lines. Photoresist removal is accomplished via plasma oxygen ashing and careful wet cleans.

A lightly doped source and drain region, 6, is next formed via ion implantation of phosphorous, at an energy between about 20 to 50 KeV, at a dose between about 1E13 to 1E14 atoms/cm$^2$. This is schematically shown in FIG. 2a, but not shown in FIG. 2b. A sidewall insulator layer of silicon nitride, or a composite layer of underlying silicon oxide, and overlying silicon nitride, is next deposited using either LPCVD or PECVD procedures, at a temperature between about 400° to 700° C., to a thickness between about 1500 to 4000 Angstroms. An anisotropic RIE procedure, using Cl$_2$ as an etchant for silicon nitride, (CHF$_3$ would be used to etch the silicon oxide layer, if a composite sidewall insulator layer were used), is used to create silicon nitride spacers 7, on the sidewalls of polysilicon word lines, shown schematically in FIG. 2a. There polysilicon word lines are now silicon nitride encapsulated via silicon nitride layer 5, and silicon nitride spacer 7. A heavily doped N-type source and drain region, 8, is then formed via ion implantation of arsenic, at an energy between about 30 to 80 KeV, at a dose between about 1E15 to 1E16 atoms/cm$^2$. The result of this procedure is schematically shown in FIGS. 2a and 2b.

A first insulator layer 9, comprised of either silicon oxide, formed from LPCVD or PECVD procedures, using tetraethylorthosilicate, (TEOS) as a source, or borophosphosilicate, (BPSG), again formed from either PECVD or LPCVD procedures, is next, to a thickness between about 2000 to 7000 Angstroms. This is shown schematically in FIGS. 2a and 2b. Not shown in these drawings is the opening of bit line contact hole 24, shown in FIG. 1. This is accomplished via conventional photolithographic and RIE procedures, using CHF$_3$ as an etchant, opening bit line contact hole 24, in first insulator layer, 9, exposing the top surface of heavily doped source and drain region, 8. Photoresist removal is performed via use of plasma oxygen asking and careful wet cleans. Finally a first polysilicon layer 10a, shown schematically in FIGS. 2a and 2b, is deposited using LPCVD procedures, at a temperature between about 500° to 700° C., to a thickness between about 1000 to 3000 Angstroms. Polysilicon layer 10a, can be grown intrinsically, and doped via ion implantation procedures, using arsenic or phosphorous, or polysilicon layer 10a, can be grown using in situ doping techniques, via the addition of either arsine or phosphine, to a silane ambient. Polysilicon layer 10a, can also be capped with a tungsten silicide layer, to improve conductivity.

Figure 3A:
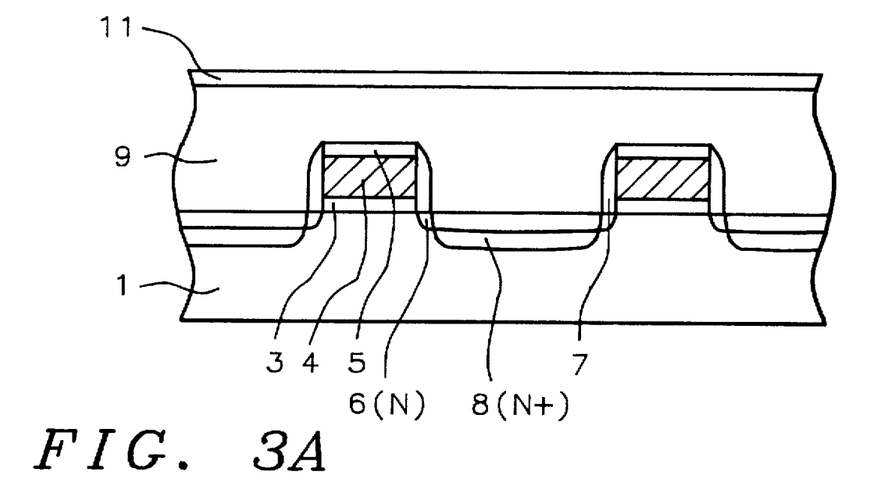
Figure 3B:
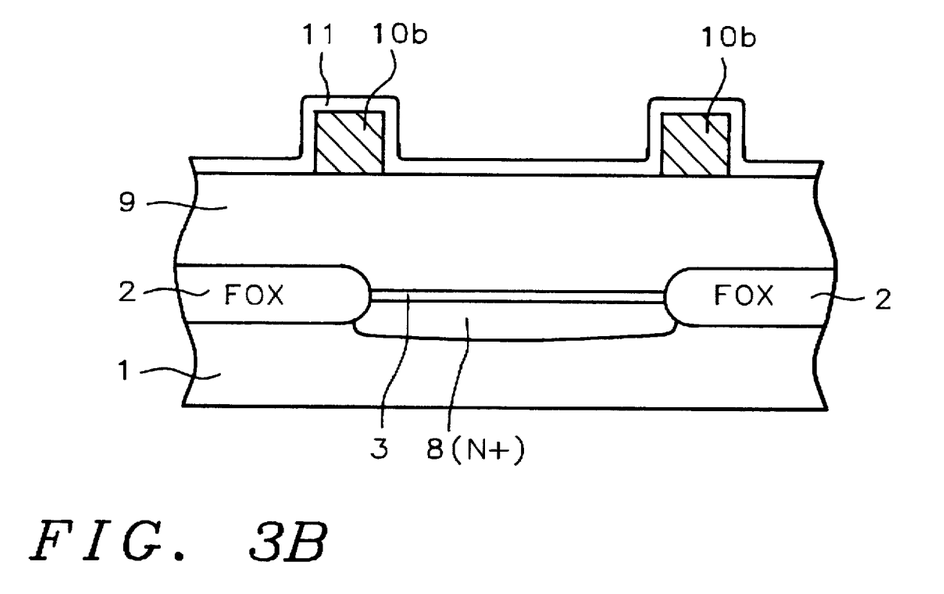

Polysilicon layer 10a, is next patterned, using conventional photolithography, and anisotropic RIE procedures, using Cl$_2$ as an etchant, to create bit line structures 10b, shown schematically in FIG. 3b. FIG. 3a, the schematic cross-section, using the AA' direction, shows the removal of polysilicon layer 10a. A first interlevel silicon nitride layer 11, is shown completely covering bit line structures 10b, and residing on first insulator layer 9, in FIG. 3b, while first interlevel silicon nitride layer 11, is shown overlying first insulator layer 9, in FIG. 3a. First interlevel silicon nitride layer 11, is deposited using LPCVD or PECVD procedures, at a temperature between about 500° to 850° C., to a thickness between about 500 to 1000 Angstroms.

Figure 4A:
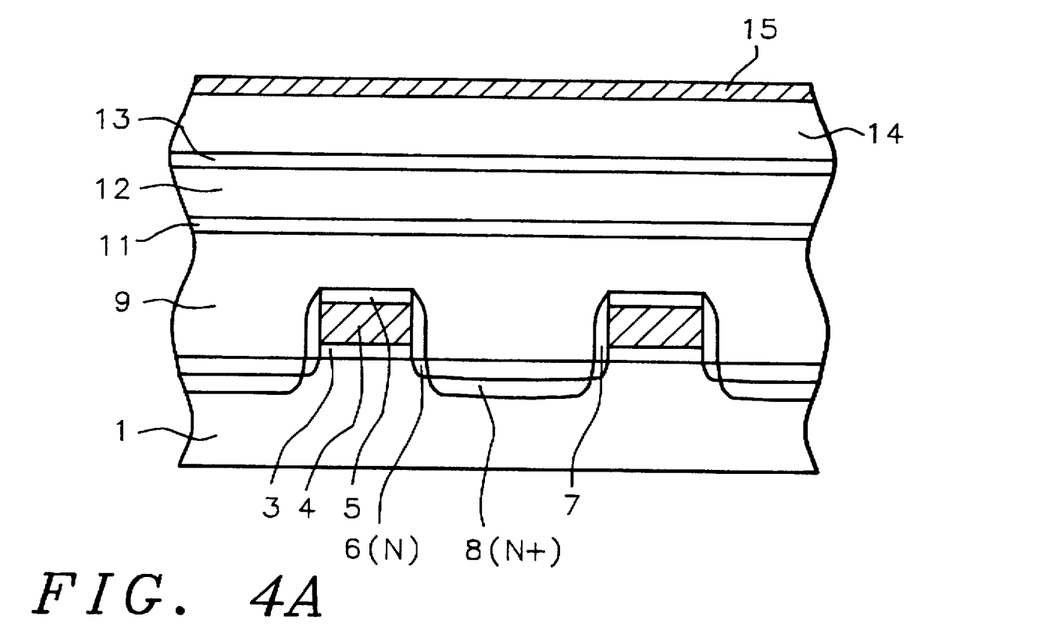
Figure 4B:
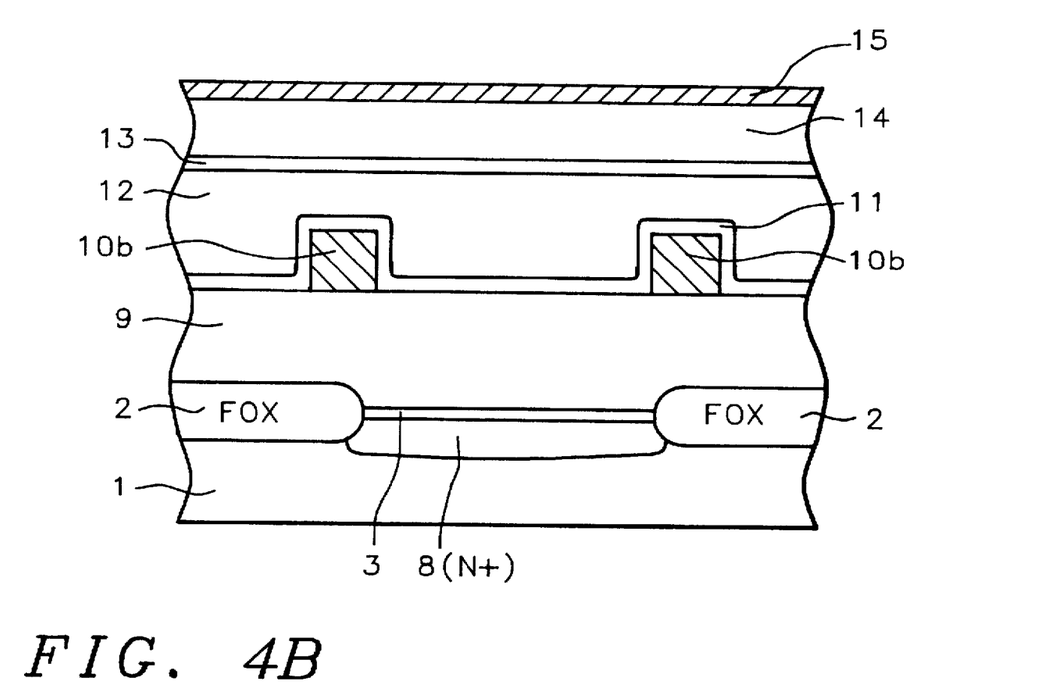

FIGS. 4a and 4b, illustrate a series of insulator and polysilicon layers, needed for the subsequent creation of the storage node contact hole. A second insulator layer 12, again comprised of either a TEOS grown silicon oxide layer, or a BPSG layer, is deposited on the first interlevel silicon nitride layer 11, using PECVD or LPCVD procedures a temperature between about 500° to 800° C., to a thickness between about 4000 to 7000 Angstroms. Planarization of second insulator layer 12, needed to create a smooth top surface topography, is performed using chemical mechanical polishing, (CMP), procedures, or RIE procedures. A deposition of an overlying, second interlevel silicon nitride layer 13, is then performed, again using either LPCVD or PECVD procedures, at a temperature between about 500° to 850° C., to a thickness between about 500 to 1000 Angstroms. A third insulator layer 14, again either a TEOS grown silicon oxide layer, or a BPSG layer, is deposited using LPCVD or PECVD procedures, a temperature between about 500° to 800° C., to a thickness between 3000 to 8000 Angstroms. Finally a second polysilicon layer 15, is deposited using LPCVD procedures, at a temperature between about 500° to 7000° C., to a thickness between about 500 to 2000 Angstroms. Second polysilicon layer 15, can be intrinsic.

Figure 5A:
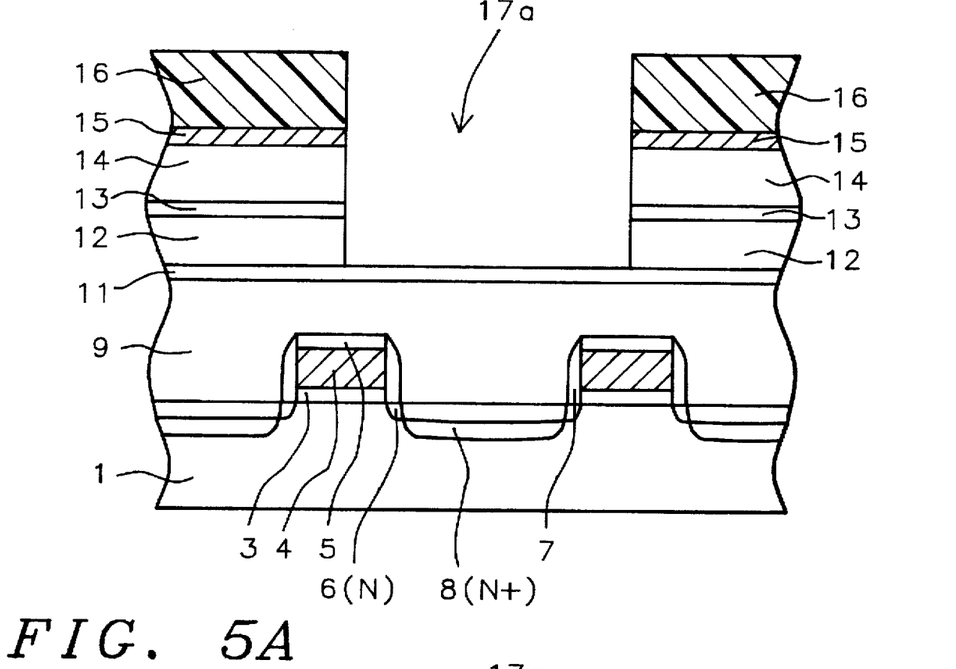
Figure 5B:
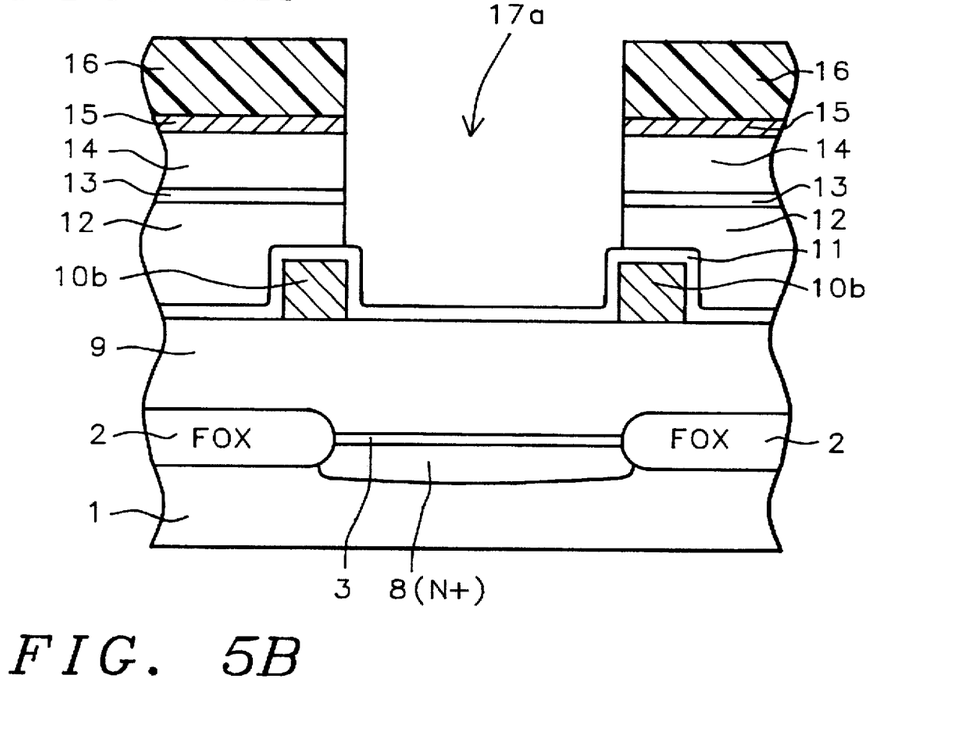

A first storage node opening 17a, for the storage node contact hole is next addressed. Photoresist shape 16, is used as a mask to allow anisotropic RIE procedures to be employed to create first storage node opening 17a, in second polysilicon layer 15, in third insulator layer 14, in second interlevel silicon nitride layer 13, and in second insulator layer 12. The etching is accomplished using $Cl_2$ as an etchant for second polysilicon layer 15, $CHF_3$, as an etchant for third insulator layer 14, $Cl_2$ as an etchant for second interlevel silicon nitride layer 13, and $CHF_3$ as an etchant for second insulator layer 12. The RIE procedure uses the selectivity of $CHF_3$, that is a slower removal rate for silicon nitride, compared to second insulator layer 12, to prevent first interlevel silicon nitride layer 11, from being penetrated. The result of this procedure is schematically shown for direction AA', in FIG. 5a, in which first opening 17a, is shown terminating at the first interlevel nitride layer 11, while FIG. 5b, schematically showing a cross-sectional view in the BB' direction, also shows first storage node opening 17a, terminating at first interlevel silicon nitride layer 11, where first interlevel silicon nitride layer 11, overlies polysilicon bit lines 10b.

Figure 6A:
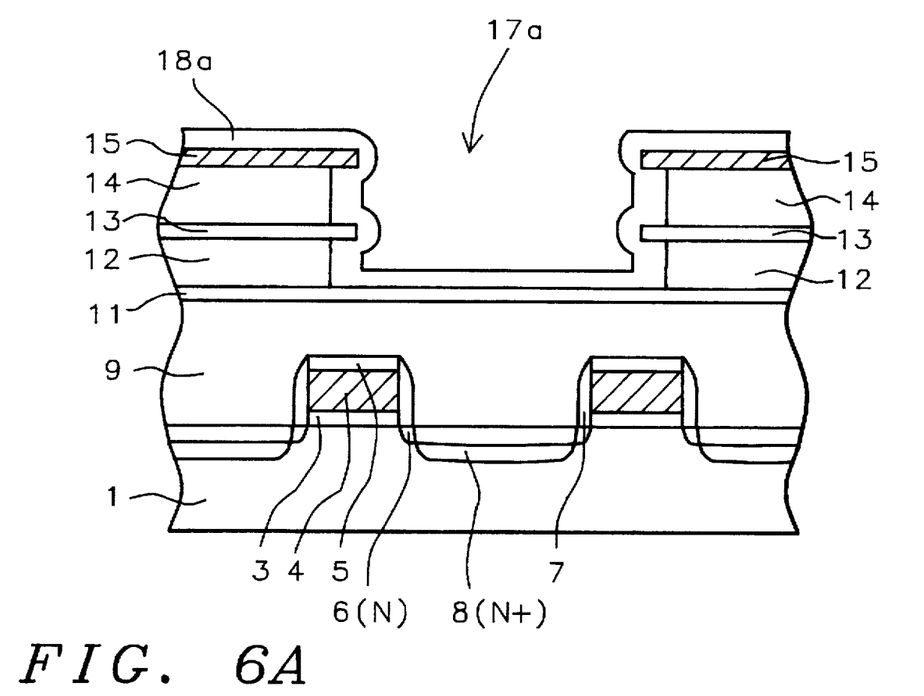
Figure 6B:
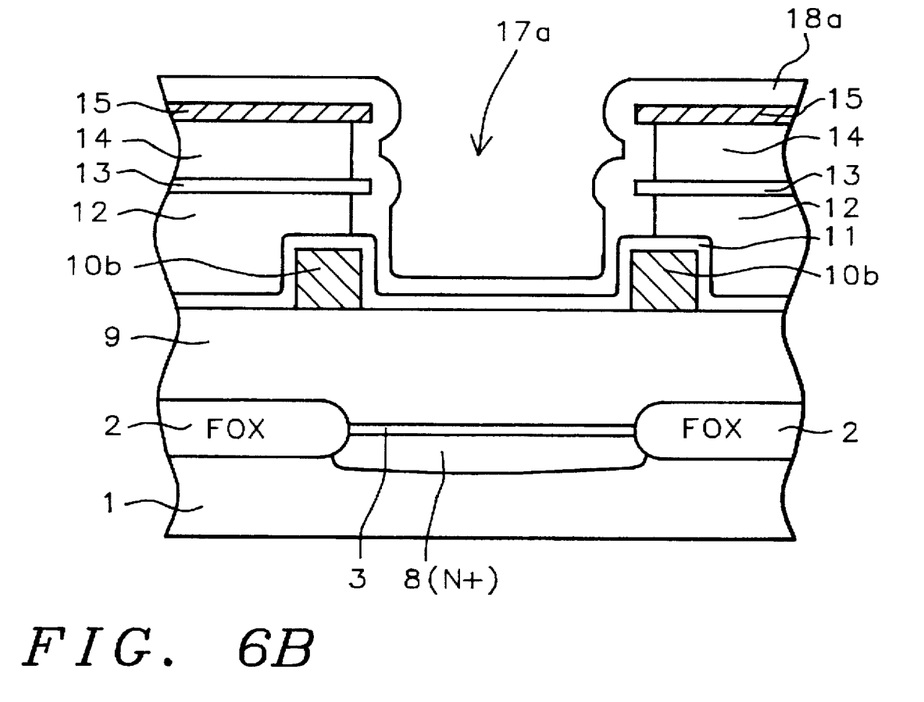

First storage node opening 17a, is next subjected to an isotropic, wet buffered hydrofluoric acid solution, used to recess back the exposed sides of third insulator layer 14, as well as the exposed sides of second insulator layer 12, below second polysilicon layer 15, and second interlevel silicon nitride layer 13. A fourth insulator layer 18a, of silicon oxide, deposited using LPCVD or PECVD procedures, a temperature between about 500° to 800° C., to a thickness between about 500 to 1000 Angstroms, using TEOS as a source,is used to conformally coat first opening 17a, filling the recesses in third insulator layer 14, and second insulator layer 12. The result of this deposition is schematically shown for cross-sections in the AA" direction in FIG. 6a, and schematically shown for cross-sections in the BB', direction in FIG. 6b.

Figure 7A:
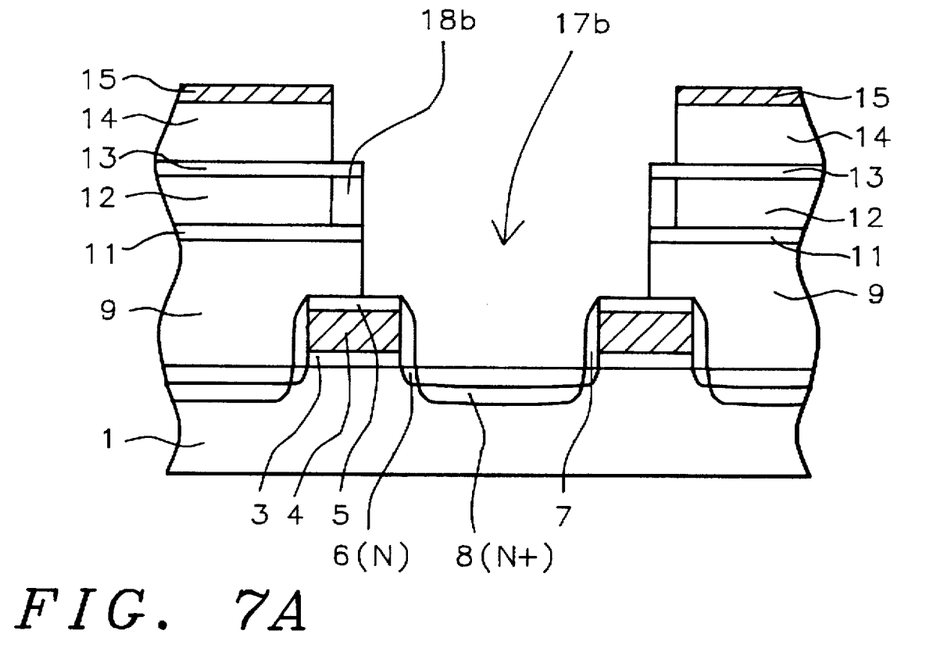
Figure 7B:
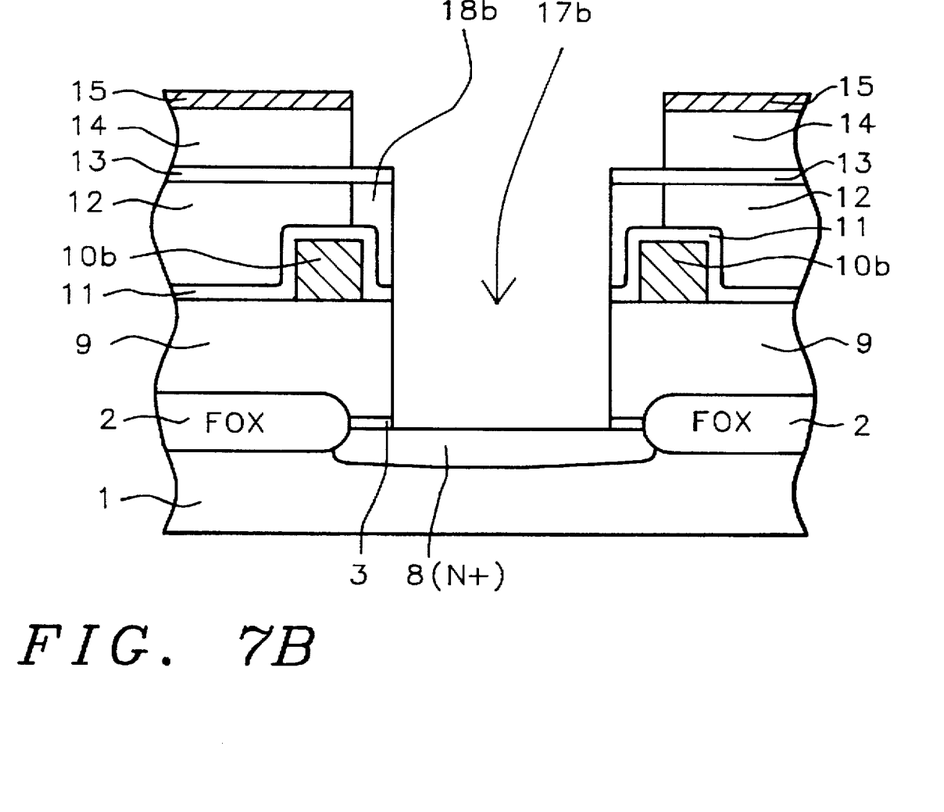

The deep pocket, storage node contact opening 17b, is next formed, in first opening 17a, via an anisotropic RIE procedure, using $CHF_3$ as an etchant for fourth insulator layer 18a, residing on first interlevel silicon nitride layer 11, using $Cl_2$ as an etchant for first interlevel silicon nitride layer 11, and using $CHF_3$ as an etchant for first insulator layer 9, exposing source and drain region 8. The deep pocket, storage node contact hole 17b, is shown cross-sectionally for the AA' direction, in FIG. 7a, and shown cross-sectionally for the BB' direction, in FIG. 7b. The procedure results in the removal of fourth insulator layer 18a, in the region in which fourth insulator layer 18a, interfaced third insulator layer 14, thus creating insulator spacers 18b, interfacing second insulator layer 12, and adding additional passivation for the silicon nitride covered, polysilicon bit lines. In additional the creation of insulator spacers 18b, only in regions interfacing first insulator layer 9, results in a tapered deep pocket, storage node contact hole, larger in diameter at the top, than at the bottom, as schematically illustrated in FIGS. 7a and 7b.

Figure 8A:
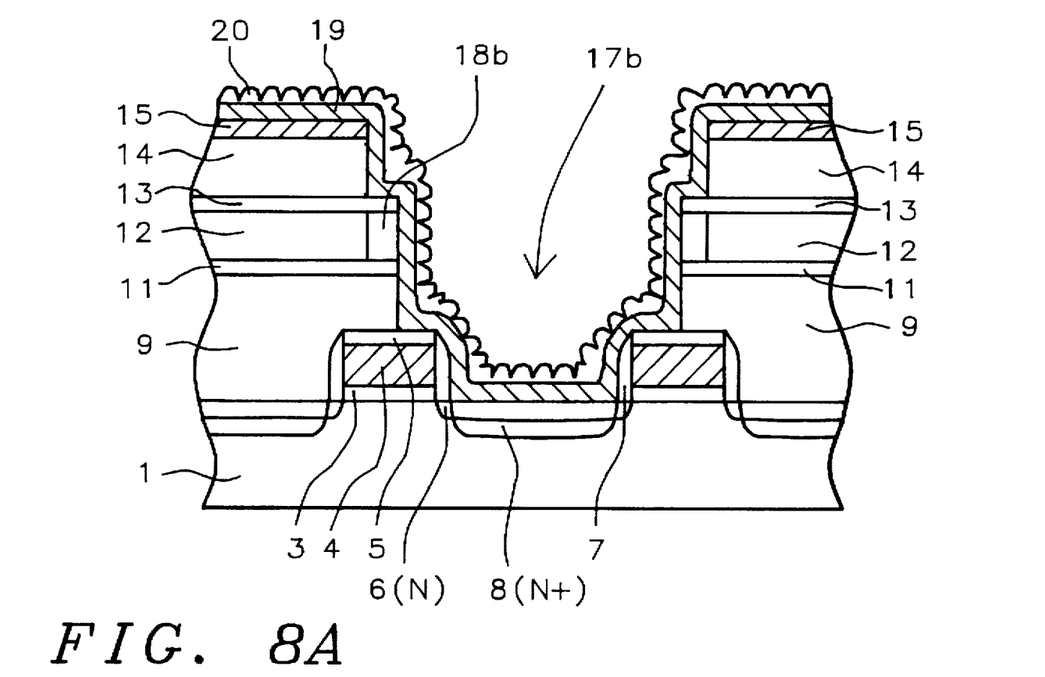
Figure 8B:
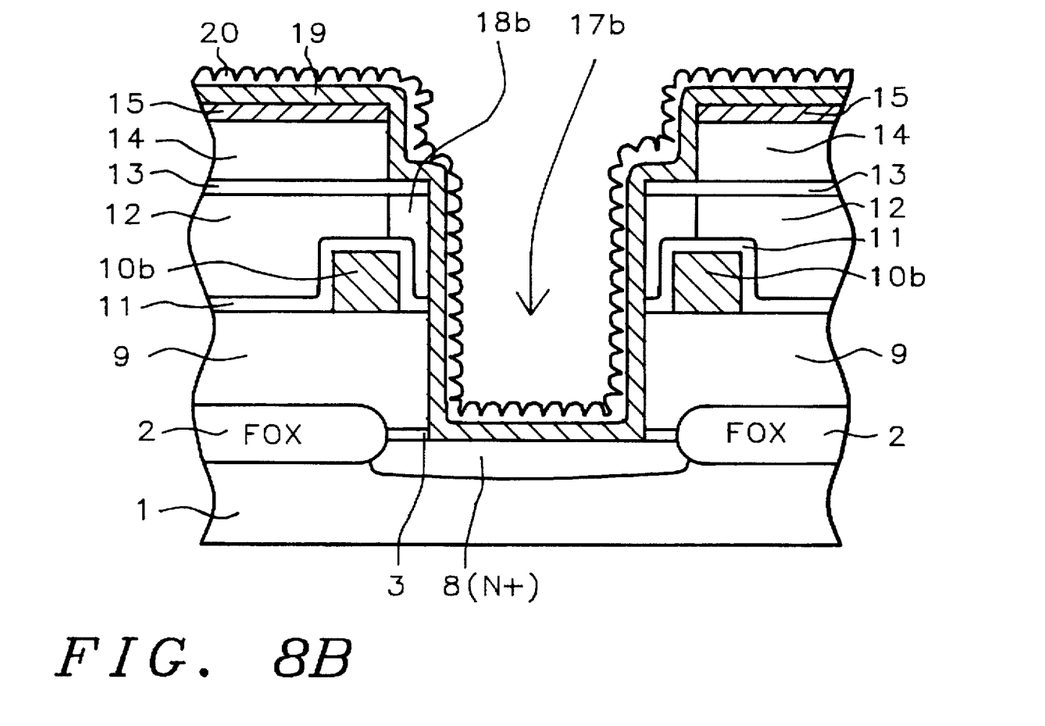
Figure 9A:
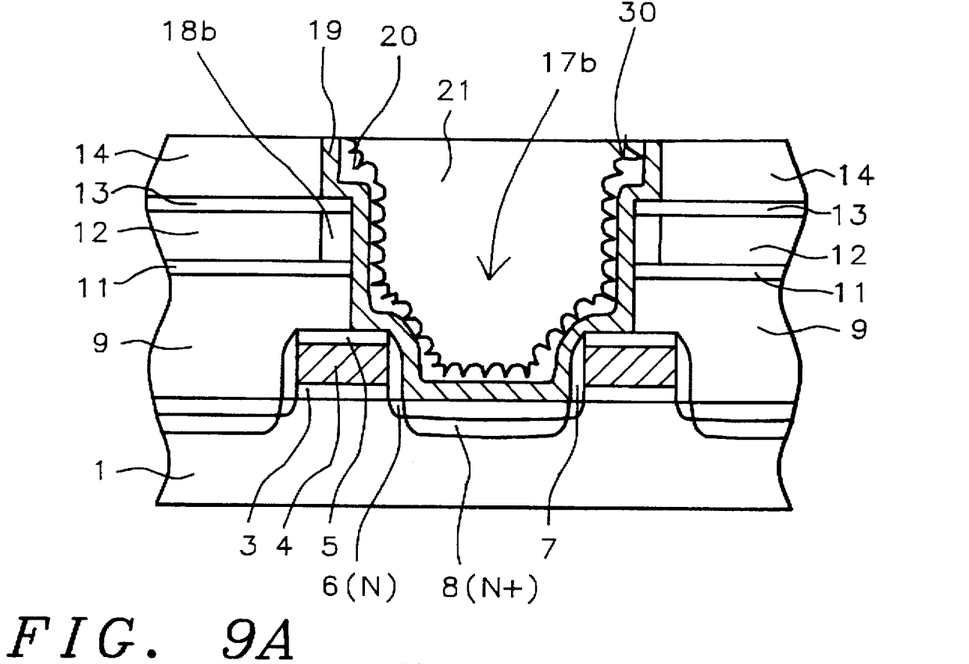
Figure 9B:
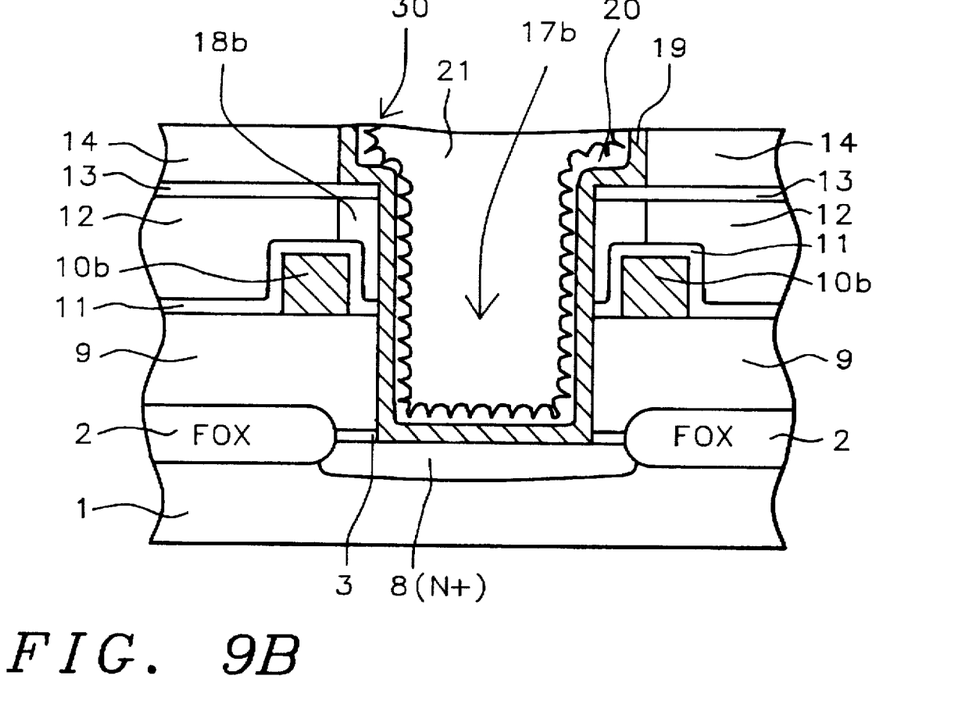

The formation of the storage node structure is next addressed, and shown schematically in FIGS. 8a and 8b. A third polysilicon layer 19, is deposited using LPCVD procedures, at a temperature between about 500° to 700° C., to a thickness between about 700 to 1500 Angstroms. Third polysilicon layer 19, can be deposited intrinsically and doped via ion implantation of either arsenic or phosphorous, or third polysilicon layer 19, can be deposited using in situ N-type doping procedures, adding either phosphine, or arsine, to a silane ambient. A hemispherical grained, (HSG), silicon layer 20, is next deposited, at a temperature between about 500° to 600° C., at a pressure between about 5 to 100 mTorr, to a thickness between about 300 to 700 Angstroms, using LPCVD procedures. These deposition conditions result in the HSG silicon layer, exhibiting surface concave and convex features, allowing surface area increases to exist. A layer of either spin on glass, (SOG) 21, or a layer of BPSG 21, or photoresist 21, is next applied to a level resulting in complete filling of deep pocket, storage node contact hole 17b, but leaving the storage node materials, HSG silicon 20, as well as third polysilicon layer 19, on the top surface of second polysilicon layer 15, exposed. A CMP procedure, selectively removing HSG silicon layer 20, third polysilicon layer 19, and second polysilicon layer 15, is employed to pattern the storage node structure 30. The removal of these materials can also be accomplished using anisotropic RIE procedures, using $Cl_2$ as an etchant, to selectively remove these layers. FIGS. 9a and 9b, schematically show the result of this procedure.

Figure 10A:
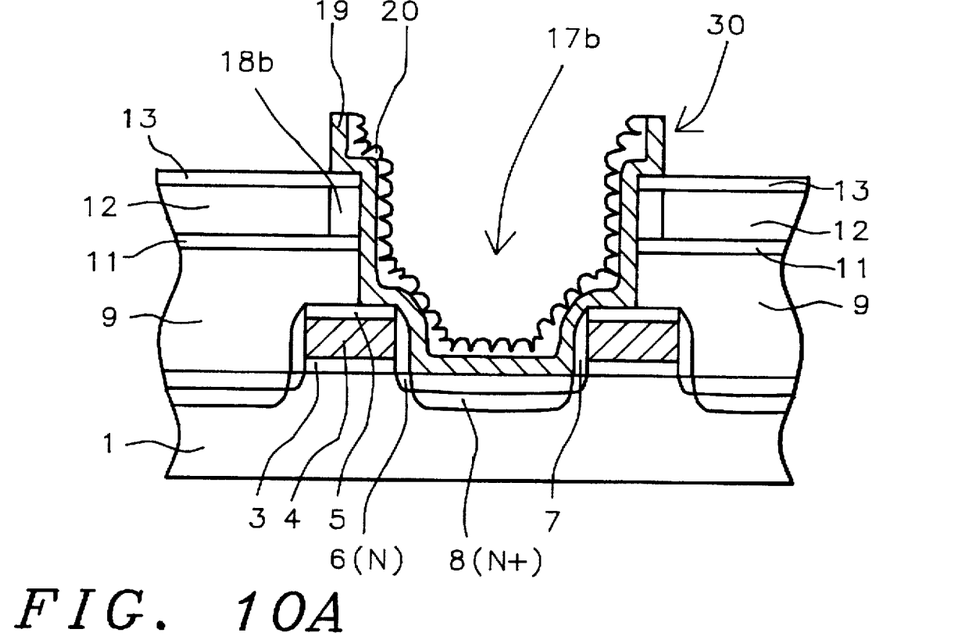
Figure 10B:
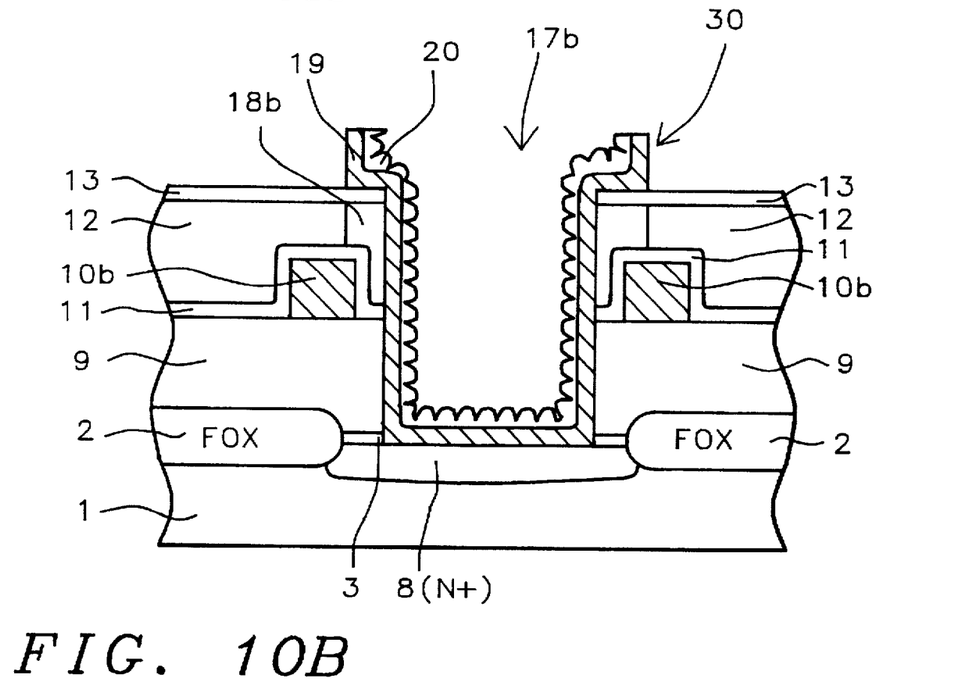

FIGS. 10a and 10b, illustrate the result of removing SOG layer 21, (or BPSG layer 21), from inside the deep pocket storage node contact hole 17b. A buffered hydrofluoric acid solution, used to remove SOG layer 21, also removes third insulator layer 14, resulting in a storage node structure 30, featuring protruding shapes, extending from the top surface of second interlevel silicon nitride layer 13, resulting in additional surface area increases. If photoresist was used to fill deep pocket, storage node contact hole 17b, a plasma oxygen ash treatment is used to remove the photoresist, followed by the buffered hydrofluoric acid procedure, used to remove third insulator layer 14.

Figure 11A:
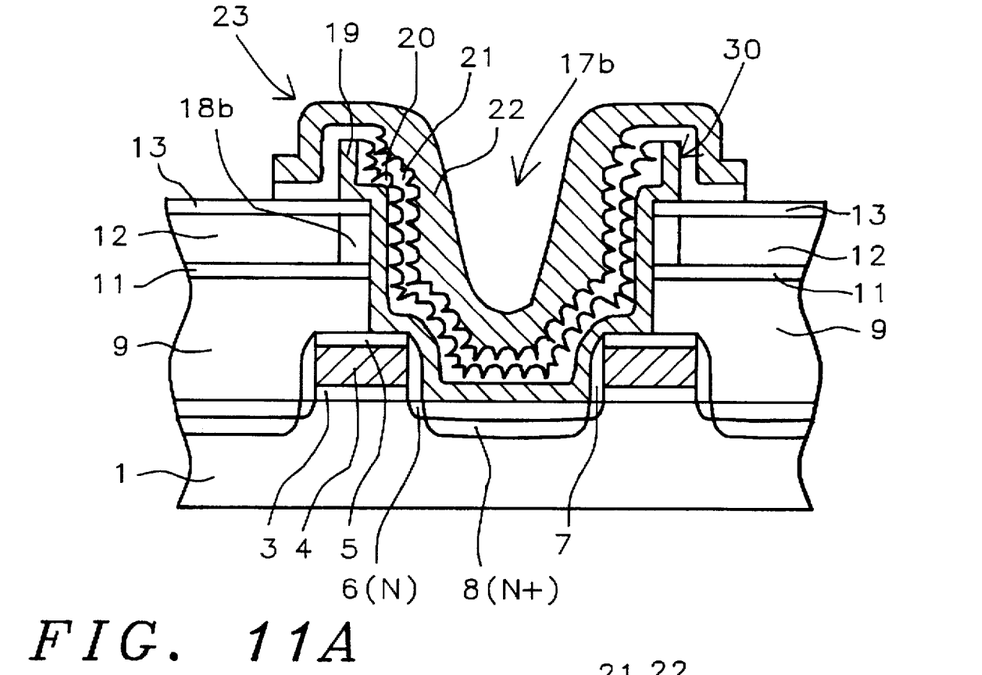
Figure 11B:
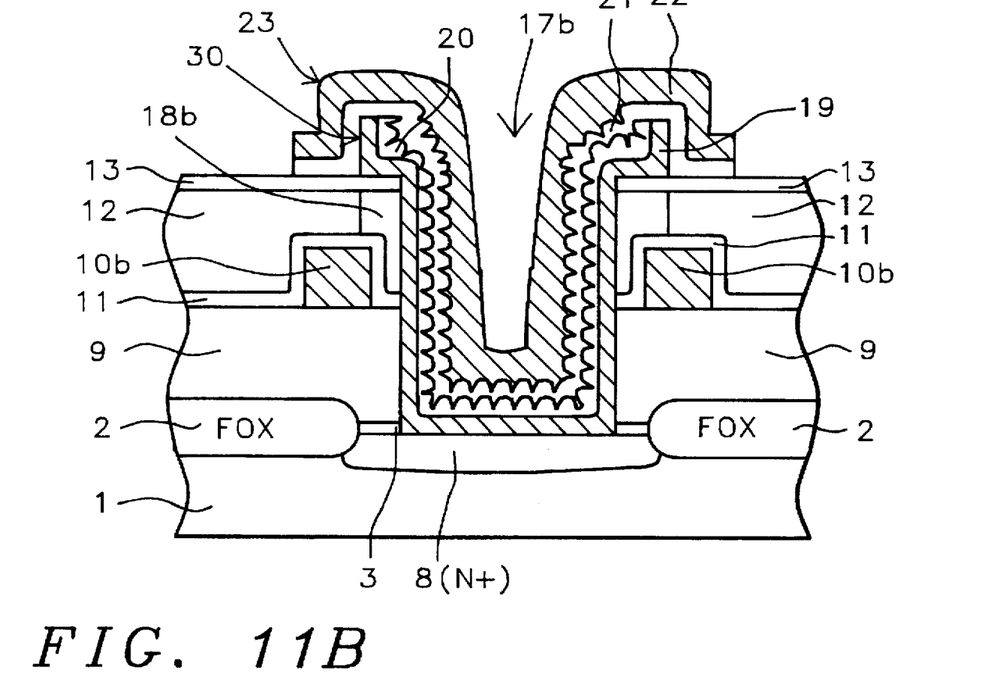

A deep pocket, COB structure 23, is finally formed, and schematically shown in FIGS. 11a and 11b. First a capacitor dielectric layer 21, is formed on the storage node structure 30. The capacitor dielectric layer can be an oxidized silicon nitride layer, (ONO), formed to an equivalent silicon oxide thickness of between about 40 to 80 Angstroms. The capacitor dielectric layer is formed by creating a thermally grown silicon oxide layer, at a thickness between about 10 to 20 Angstroms, followed by the deposition of a silicon nitride layer, between about 10 to 50 Angstroms in thickness, then subjected to a thermal oxidation procedure, used to convert the silicon nitride layer to a silicon oxynitride layer. Next a fourth polysilicon layer 22, is deposited using LPCVD procedures, at a temperature between about 500° to 700° C., to a thickness between about 1000 to 3000 Angstroms, and again doped using either in situ doping procedures, during deposition, or doped via ion implantation procedures. Photolithographic and RIE procedures, using Cl₂ as an etchant for fourth polysilicon layer 22, and for capacitor dielectric layer 21, form deep pocket COB structure 23. Photoresist removal is accomplished via plasma ashing and careful wet cleans.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a dynamic random accessed memory DRAM device, on a semiconductor substrate, incorporating underlying transfer gate transistors, polysilicon bit line structures, and a stacked capacitor structure, overlying the polysilicon bit line structures, comprising the steps of:

forming said transfer gate transistors, encapsulated by silicon nitride;

depositing a first insulator layer on said transfer gate transistors;

forming said polysilicon bit line structures, overlying said first insulator layer, and contacting a first source and drain region, using a contact hole opening in said first insulator layer;

depositing a first interlevel silicon nitride layer on said polysilicon bit line structures, and on top surface of said first insulator layer;

depositing a series of layers on said first interlevel silicon nitride layer, comprised of, a second insulator layer, a second interlevel silicon nitride layer, a third insulator layer, and a second polysilicon layer;

forming a first storage node opening in said series of layers, between said polysilicon bit line structures;

recessing the exposed sides of said third insulator layer, and of said second insulator layer, in said first storage node opening;

depositing a fourth insulator layer;

using said first storage node opening as a mask to form a storage node contact hole, via removal of said fourth insulator layer, removal of said first interlevel silicon nitride layer, and removal of said first insulator layer, exposing a second source and drain region, and forming insulator spacers, from said fourth insulator layer, on the exposed sides of said second insulator layer, and on sides of said polysilicon bit line structures, covered by said first interlevel silicon nitride layer;

depositing a third polysilicon layer, conformally coating said storage node contact hole;

depositing a hemispherical grained (HSG) silicon layer on said third polysilicon layer;

removing said hemispherical grained silicon, said third polysilicon layer, and said second polysilicon layer, from a top surface of said third insulator layer;

removing said third insulator layer, from a top surface of said second interlevel silicon nitride layer, forming a storage node structure, comprised of overlying, said hemispherical grained silicon layer, and underlying, said third polysilicon layer, in said storage node contact hole, with protruding shapes comprised of said hemispherical grained silicon and said third polysilicon layer, extending from the surface of said second interlevel silicon nitride layer;

forming a capacitor dielectric layer on said storage node structure; and forming an upper electrode to complete said stacked capacitor structure, overlying said polysilicon bit line structures.

2. The method of claim 1, wherein said transfer gate transistors are comprised a polysilicon gate structure, on a silicon dioxide gate insulator layer, between about 50 to 200 Angstroms in thickness, capped with a silicon nitride layer, and silicon nitride sidewall spacers, with N type source and drain regions.

3. The method of claim 1, wherein said polysilicon bit line structures are formed from a polysilicon layer, deposited using low pressure chemical vapor deposition LPCVD procedures, at a temperature between about 500° to 700° C., to a thickness between about 1000 to 3000 Angstroms, and patterned via reactive ion etch RIE procedures, using Cl₂ as an etchant.

4. The method of claim 1, wherein said first interlevel silicon nitride layer is deposited using LPCVD or plasma enhanced chemical vapor deposition PECVD procedures, at a temperature between about 500° to 850° C., to a thickness between about 500 to 1000 Angstroms.

5. The method of claim 1, wherein said series of layers, overlying said first interlevel silicon nitride layer is comprised of: said second insulator layer of either a silicon oxide layer, obtained from a tetraethylorthosilicate TEOS source, or a borophosphosilicate BPSG layer, deposited using LPCVD or PECVD procedures, to a thickness between about 4000 to 7000 Angstroms; said second interlevel silicon nitride layer, deposited using PECVD or LPCVD procedures, at a temperature between about 500° to 850° C., to a thickness between about 500 to 1000 Angstroms; a third insulator layer of either a silicon oxide layer, obtained from a TEOS source, or a BPSG layer, deposited using LPCVD or PECVD procedures, to a thickness between about 3000 to 8000 Angstroms; and said second polysilicon layer, deposited using LPCVD procedures, at a temperature between about 500° to 700° C., to a thickness between about 500 to 2000 Angstroms.

6. The method of claim 1, wherein said first storage node opening is created in said series of layers via RIE procedures using Cl₂ as an etchant for said second polysilicon layer, using CHF₃ as an etchant for said third insulator layer, using Cl₂ as an etchant for said second interlevel silicon nitride layer, and using CHF₃ as an etchant for said second insulator layer.

7. The method of claim 1, wherein the exposed sides of said third insulator layer, and of said second insulator layer, in said first storage node opening are recessed via use of a buffered hydrofluoric acid solution.

8. The method of claim 1, wherein said insulator spacers, on the sides of said second insulator layer, and on the sides of said polysilicon bit line structures, covered by said first interlevel silicon nitride layer, in said storage node contact hole, are formed via the step of depositing of a fourth insulator layer, of silicon oxide, deposited using LPCVD or PECVD procedures, at a thickness between about 500 to 1000 Angstroms, followed by anisotropic RIE procedures, using CHF₃ as an etchant.

9. The method of claim 1, wherein said storage node contact hole is formed via anisotropic RIE procedures, using CHF₃ as an etchant for said fourth insulator layer, Cl₂ as an etchant for said first interlevel silicon nitride layer, and CHF₃ as an etchant for said first insulator layer.

10. The method of claim 1, wherein said third polysilicon layer is deposited via LPCVD procedures, at a temperature between about 500° to 700° C., to a thickness between about 700 to 1500 Angstroms, using either in situ, N type doping procedures, or deposited intrinsically and doped via ion implantation of either arsenic or phosphorous.

11. The method of claim 1, wherein said HSG silicon layer is deposited using LPCVD procedures, at a temperature between about 500° to 600° C., at a pressure between about 5 to 100 mTorr, and to a thickness between about 300 to 700 Angstroms.

12. The method of claim 1, wherein said storage node structure is formed by removal of said HSG silicon, and said third polysilicon layer, from the top surface of said third insulator layer via either chemical mechanical polish, CMP procedures, or via an anisotropic RIE procedure, using $Cl_2$ as an etchant.

13. The method of claim 1, wherein said capacitor dielectric layer is oxidized silicon nitride layer ONO, at an equivalent silicon oxide thickness between about 40 to 80 Angstroms, created by an initial thermal oxidation to form a silicon oxide layer, between about 10 to 20 Angstroms, followed by a deposition of a silicon nitride layer, to a thickness between about 10 to 50 Angstroms, and thermal oxidation of said silicon nitride layer, creating a silicon oxynitride layer, on the underlying, said silicon oxide layer.

14. The method of claim 1, wherein said upper electrode, of said stacked capacitor structure, is formed by depositing a fourth polysilicon layer using LPCVD procedures, at a temperature between about 500° to 700° C., to a thickness between about 1000 to 3000 Angstroms.

15. A method of fabricating a deep pocket, capacitor over bit line, (COB), structure, for a DRAM cell, on a semiconductor substrate, comprising the steps of:

providing a transfer gate transistor, on said semiconductor substrate;

forming polysilicon bit line structures, on a top surface of a first insulator layer, and contacting a first source and drain region, of said transfer gate transistor, exposed in a bit line contact hole, in said first insulator layer;

depositing a first interlevel silicon nitride layer, completely covering said polysilicon bit line structures;

depositing a second insulator layer on said first interlevel silicon nitride layer;

planarizing said second insulator layer;

depositing a second interlevel silicon nitride layer on said second insulator layer;

depositing a third insulator layer on said second interlevel silicon nitride layer;

depositing a first polysilicon layer on said third insulator layer;

forming a first storage node opening, between said polysilicon bit line structures, in said first polysilicon layer, in said third insulator layer, in said second interlevel silicon nitride layer, and in said second insulator layer, terminating at a top surface of said first interlevel silicon nitride layer;

recessing sides of said third insulator layer, and of said second insulator layer, exposed in said first storage node opening;

depositing a fourth insulator layer, filling recessed regions in said third insulator layer, and in said second insulator layer;

anisotropic etching of said fourth insulator layer, of said first interlevel silicon nitride layer, and of said first insulator layer, in said first storage node opening, creating a deep pocket, storage node contact hole, exposing a second source and drain region, of said transfer gate transistor, while forming insulator spacers, comprised of said fourth insulator layer, on the sides of said polysilicon bit line structures, covered by said first interlevel silicon nitride layer;

depositing a second polysilicon layer on a top surface of said first polysilicon layer, and conformally coating said deep pocket, storage node contact hole, contacting said second source and drain region;

depositing an HSG silicon layer on said second polysilicon layer;

filling said deep pocket, storage node contact hole, with said fifth insulator layer;

removing said HSG silicon layer, said second polysilicon layer, and said first polysilicon layer, from a top surface of said third insulator layer;

removing said fifth insulator layer from said deep pocket, storage node contact hole, and said third insulator layer from top surface of said second interlevel silicon nitride layer, creating a storage node structure, comprised of said HSG silicon layer, and of said second polysilicon layer, in said deep pocket, storage node contact hole;

forming a capacitor dielectric layer on said storage node structure;

depositing a third polysilicon layer on said capacitor dielectric layer; and patterning of said third polysilicon layer to form an upper electrode, for said deep pocket, COB, structure.

16. The method of claim 15, wherein said polysilicon bit line structures are formed from a polysilicon layer, between about 1000 to 3000 Angstroms in thickness, and patterned via RIE procedures, using $Cl_2$ as an etchant.

17. The method of claim 15, wherein said first interlevel silicon nitride layer, covering said polysilicon bit line structures, is deposited using LPCVD or PECVD procedures, at a temperature between about 500° to 850° C., to a thickness between about 500 to 1000 Angstroms.

18. The method of claim 15, wherein said second insulator layer is a silicon oxide layer, obtained from a TEOS source, or a BPSG layer, deposited using LPCVD or PECVD procedures, at a temperature between about 500° to 800° C., to a thickness between about 4000 to 7000 Angstroms.

19. The method of claim 15, wherein said second interlevel silicon nitride layer is deposited using LPCVD or PECVD procedures, at a temperature between about 500° to 850° C., to a thickness between about 500 to 1000 Angstroms.

20. The method of claim 15, wherein said third insulator layer is a silicon oxide layer, obtained from a TEOS source, or a BPSG layer, deposited using LPCVD or PECVD procedures, at a temperature between about 500° to 800° C., to a thickness between about 3000 to 8000 Angstroms.

21. The method of claim 15, wherein said first polysilicon layer is deposited using LPCVD procedures, at a temperature between about 500° to 700° C., to a thickness between about 500 to 2000 Angstroms.

22. The method of claim 15, wherein said first storage node opening is formed via anisotropic RIE procedures, using $Cl_2$ as an etchant for said first polysilicon layer, using $CHF_3$ as an etchant for said third insulator layer, using $Cl_2$ as an etchant for said second interlevel silicon nitride layer, and using $CHF_3$ as an etchant for said second insulator layer.

23. The method of claim 15, wherein the exposed sides of said third insulator layer, and the exposed sides of said second insulator layer, are recessed via use of a buffered hydrofluoric acid solution.

24. The method of claim 15, wherein said fourth insulator layer, is silicon oxide, deposited using LPCVD or PECVD procedures, at a temperature between about 500° to 800° C., to a thickness between about 500 to 1000 Angstroms.

25. The method of claim 15, wherein said deep pocket, storage node contact hole, is formed via anisotropic RIE procedures, using $CHF_3$ as an etchant for said fourth insulator layer, using $Cl_2$ as an etchant for said first interlevel silicon nitride layer, and using $CHF_3$ as an etchant for said first insulator layer.

26. The method of claim 15, wherein said insulator spacers, on the sides of said second insulator layer, and on said sides of said polysilicon bit line structures, covered by said first interlevel silicon nitride layer, are formed via anisotropic RIE procedures, applied to said fourth insulator layer, using $CHF_3$ as an etchant.

27. The method of claim 15, wherein said second polysilicon layer is deposited using LPCVD procedures, at a temperature between about 500° to 700° C., to a thickness between about 700 to 1500 Angstroms, using either in situ doping procedures, via an addition of either arsine or phosphine, to a silane ambient, or doped via arsenic, or phosphorous, ion implantation procedures.

28. The method of claim 15, wherein said HSG silicon layer is deposited using LPCVD procedures, at a temperature between about 500° to 600° C., at a pressure between about 5 to 100 mTorr, and to a thickness between about 300 to 700 Angstroms.

29. The method of claim 15, wherein said fifth insulator layer, used to fill said deep pocket, storage node contact hole, is a spin on glass material, or a BPSG layer.

30. The method of claim 15, wherein step of removing said HSG silicon layer, and said second polysilicon layer, from the top surface of said third insulator layer, is performed using CMP procedures.

31. The method of claim 15, wherein said capacitor dielectric layer is ONO, with an equivalent silicon oxide thickness between about 40 to 80 Angstroms, created by growing a thin silicon oxide layer on said storage node electrode, at a thickness between about 10 to 20 Angstroms, depositing between about 10 to 50 Angstroms of a silicon nitride layer, and oxidizing said silicon nitride layer to from a silicon oxynitride layer on said thin silicon oxide layer.

32. The method of claim 15, wherein said third polysilicon layer is deposited using LPCVD procedures, at a temperature between about 500° to 700° C., to a thickness between about 1000 to 3000 Angstroms.

* * * * *